United States Patent [19]

Erhart et al.

[11] Patent Number: 5,604,449

[45] Date of Patent: Feb. 18, 1997

[54] DUAL I/O LOGIC FOR HIGH VOLTAGE CMOS CIRCUIT USING LOW VOLTAGE CMOS PROCESSES

[75] Inventors: Richard A. Erhart, Chandler; Thomas W. Ciccone, Paradise Valley, both of Ariz.

[73] Assignee: Vivid Semiconductor, Inc., Chandler, Ariz.

[21] Appl. No.: 592,920

[22] Filed: Jan. 29, 1996

[51] Int. Cl.[6] .................................. H03K 19/003
[52] U.S. Cl. .................... 326/81; 326/21; 326/121
[58] Field of Search .................. 326/9, 21, 33–34, 326/80–81, 121; 327/437, 536

[56] References Cited

U.S. PATENT DOCUMENTS

| | | | |
|---|---|---|---|
| 4,429,237 | 1/1984 | Cranford, Jr. et al. | 326/120 |
| 4,490,627 | 12/1984 | Barlow et al. | 326/121 |
| 4,575,721 | 3/1986 | DelGrange et al. | 340/776 |
| 4,636,784 | 1/1987 | DelGrange et al. | 340/771 |
| 4,689,504 | 8/1987 | Raghunathan et al. | 307/449 |
| 4,704,547 | 11/1987 | Kirsch | 307/443 |
| 4,740,713 | 4/1988 | Sakurai et al. | 307/200 |
| 4,955,696 | 9/1990 | Taniguchi et al. | 350/332 |
| 4,956,569 | 9/1990 | Olivo et al. | 307/443 |
| 5,057,715 | 10/1991 | Larsen et al. | 307/451 |
| 5,120,991 | 6/1992 | Takahashi | 307/270 |
| 5,170,155 | 12/1992 | Plus et al. | 340/784 |
| 5,457,420 | 10/1995 | Asada | 327/437 |
| 5,465,054 | 11/1995 | Erhart | 326/34 |
| 5,495,185 | 2/1996 | Goto | 326/9 X |
| 5,504,450 | 4/1996 | McPartland | 327/437 |
| 5,539,334 | 7/1996 | Clapp, III et al. | 326/9 X |

FOREIGN PATENT DOCUMENTS 5-63540  12/1993  Japan .

Primary Examiner—David R. Hudspeth
Attorney, Agent, or Firm—Cahill, Sutton & Thomas, P.L.C.

[57] ABSTRACT

CMOS transistor logic circuitry is permitted to operate at higher power supply voltages while retaining lower voltage processing geometries by providing each input signal as dual input signals that track each other within two different voltage ranges. A shield voltage is provided approximately midway between the uppermost and lowermost power supply voltages. The first input signal ranges between the lowermost power supply voltage and the shield voltage, and the second input signal ranges between the shield voltage and the uppermost power supply voltage. The first and second input signals drive the gates of n-channel and p-channel CMOS switching transistors, respectively, the drain terminals of which are coupled to first and second output terminals, respectively. N-channel and p-channel shield transistors are connected in series between the first and second output terminals, and have their gate terminals coupled to the shield voltage.

7 Claims, 3 Drawing Sheets

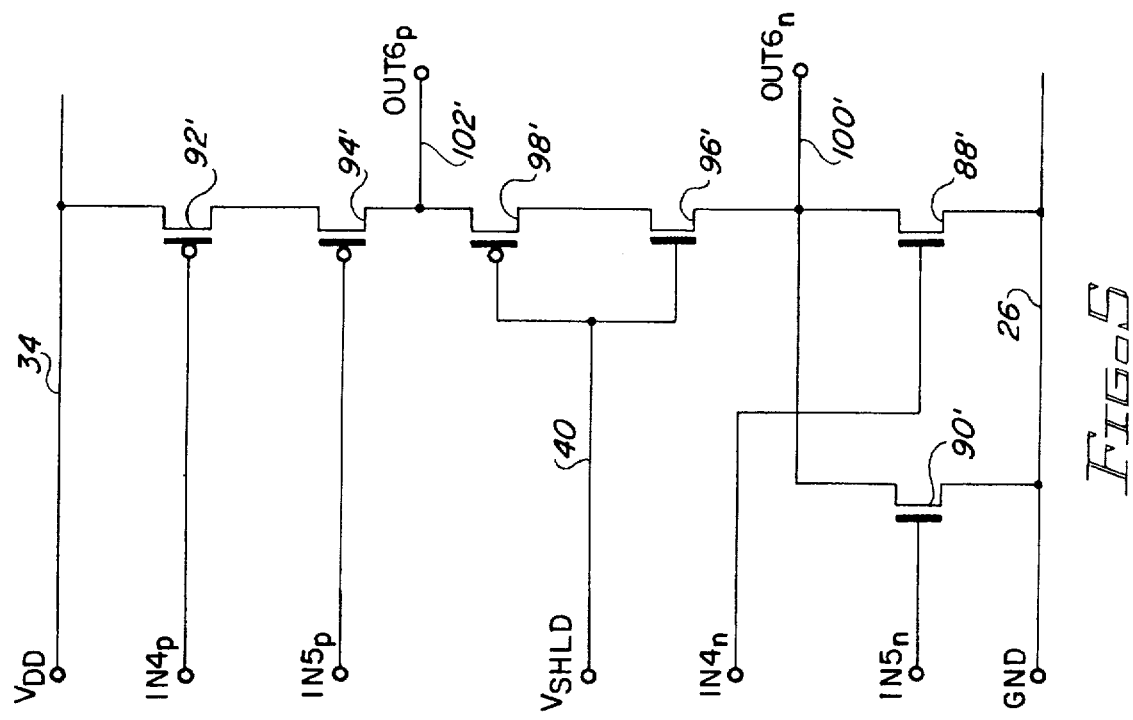
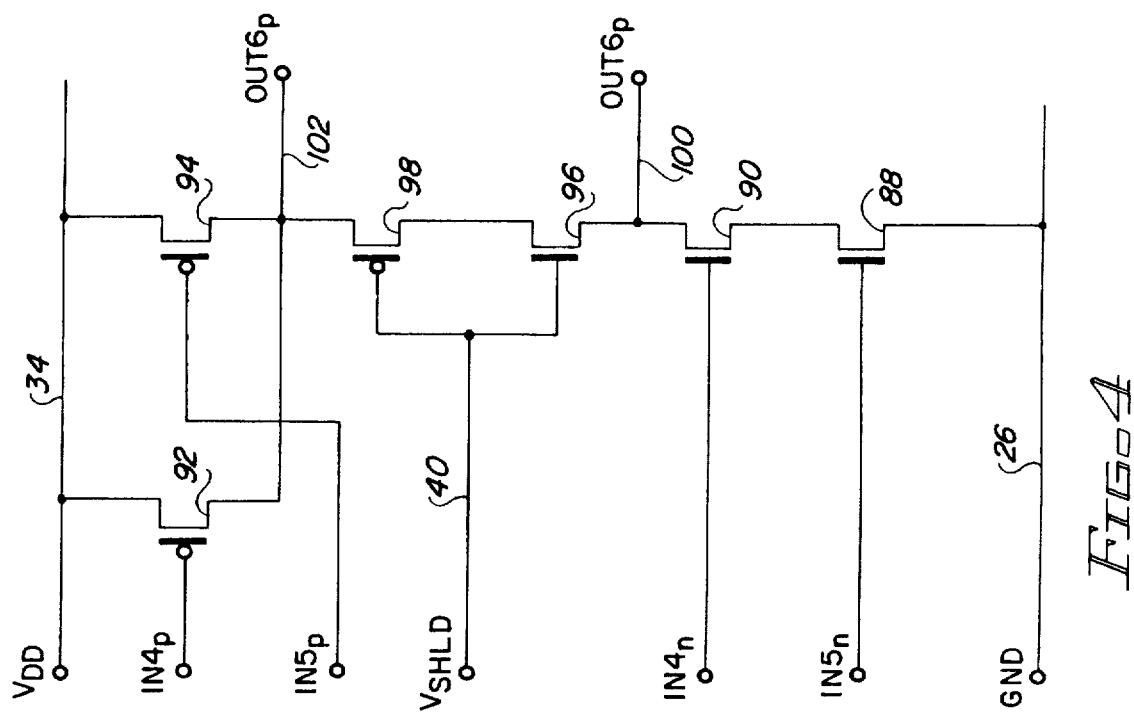

DUAL I/O LOGIC FOR HIGH VOLTAGE CMOS CIRCUIT USING LOW VOLTAGE CMOS PROCESSES

BACKGROUND OF THE INVENTION

1. Field of the Invention

The present invention relates generally to integrated CMOS transistor logic circuits, and more particularly to a form of such logic circuits which permits the use of larger power supply voltages for generating output signals of greater magnitude while retaining high density advantages of low-voltage CMOS processing.

2. Description of the Related Art

CMOS is the most widely used technology for integrated circuits today. The electrical properties of CMOS technology are well understood. The voltage that can be used to power CMOS circuits is dependent upon the physical dimensions of the individual transistors (i.e., their geometry) and the particular processing utilized in the manufacturing of the transistors.

Many CMOS integrated circuits can be operated at power supply ranges of 5 volts or less. Processing techniques have been developed and are known to those skilled in the art for producing highly-dense CMOS integrated circuits which operate over a 5 volt power supply range. These integrated circuits produce output signals which also range approximately between ground and +5 volts.

However, in many cases, the CMOS integrated circuit must drive or control some other device which requires an input signal having a larger voltage magnitude. One example is the need to drive liquid crystal displays (LCD) of the type used in hand-held games, hand-held computers, and laptop/notebook computers. LCD displays used in computer screens require a large number of input control signals which must operate at voltages from 8 volts to as high as 20 volts. If the CMOS integrated circuit is going to be capable of generating an output signal having such an increased voltage magnitude, then the power supply range for such CMOS integrated circuit must also have an increased voltage magnitude.

In general, the higher the power supply voltage needed, the larger the individual transistors must be; in addition, the use of larger power supply voltages necessitates special processing considerations. Larger device geometries and more complex processing generally result in higher manufacturing costs for a particular integrated circuit, since the total area of the integrated circuit, and the complexity of the manufacturing process, are both major factors in determining the cost of a particular circuit.

There are several mechanisms which limit the voltage that a particular CMOS transistor can tolerate. The three most critical mechanisms are:

a) channel breakdown due to excessive voltage appearing between the source and drain terminals of the CMOS transistor.

b) dielectric breakdown of the gate oxide, which is a destructive mechanism. This particular failure mechanism can also be a long term reliability problem because it has been shown that breakdown of the gate oxide is both time dependent and voltage dependent.

c) junction breakdown corresponding to the reverse voltage breakdown of the diode which appears at the source and drain of all CMOS transistors.

With respect to the failure mechanism of junction breakdown, there are actually two types of junctions in a standard CMOS integrated circuit that can breakdown, namely, the source/drain to well junction, and the source/drain to substrate junction. Of these two types of junctions, the source/drain-to-well junction will typically have the lower breakdown voltage and must be considered to be the worst case. Assuming that an n-well process is used, then the lower breakdown voltage is generally in the p channel transistors; conversely, if a p-well process is used, then the lower breakdown voltage occurs in the n channel transistors.

In a typical CMOS logic gate circuit, one or more n-channel devices are coupled between a ground power supply conductor and an output node. In addition, one or more p-channel devices are coupled between the output node and the VDD power supply conductor. When the n-channel transistors are enabled, they create a conductive path from the output node to ground. Alternatively, when the p-channel transistors are enabled, they create a conductive path from the output node to positive supply voltage conductor VDD. Thus, the output node of the logic gate switches between ground and VDD. The gate terminals of the various transistors are coupled to an external input terminal, or alternatively to an output node of a previous logic gate circuit.

In the standard CMOS logic configuration briefly described above, the gate oxide of all the transistors will see a voltage equal to the difference in the power supplies (VDD–GND). In addition, the voltage across the channel, i.e. the voltage between the drain and source, for each of such transistors will also be the difference in the power supplies (VDD–GND). The voltage across the gate oxide, and the voltage across the channel, will not always be at the maximum difference between the power supply voltages, but there is a state of the inputs which can force any of the transistors to see the maximum power supply voltage differential across the gate oxide or across the channel. Accordingly, the power supply voltages for these standard CMOS logic configuration must be chosen to prevent the occurrence of either gate oxide breakdown, impaired reliability of the gate oxide, or channel breakdown.

In addition, the junction diodes formed at the source and drain of each of the CMOS transistors in a standard logic gate will also be exposed to the maximum supply voltage differential as a reverse bias on such junction diodes. Therefore, the magnitude of the voltage of power supply VDD relative to ground cannot exceed the reverse bias junction breakdown of such devices; as indicated above, the worst case normally is observed in the source/drain-to-well junction.

As has been noted above, gate oxide breakdown is partly time-dependent, and the long term reliability of a CMOS integrated circuit is severely affected by the maximum gate oxide voltage applied to the CMOS transistors included therein. Even if the supply voltages are maintained below the theoretical gate oxide breakdown voltage, the long-term reliability of an integrated circuit using such standard CMOS logic configurations can be reduced if the maximum gate oxide voltage is permitted to be too high.

One circuit technique for allowing CMOS logic integrated circuits to tolerate higher voltages without degradation is described in U.S. Pat. No. 5,465,054, issued to Erhart, and assigned to the assignee of the present invention. In the '054 patent, so-called "supertransistors" are used to allow a full-range input signal to drive CMOS transistors made using a low-voltage CMOS process. Each supertransistor includes a CMOS input shielding transistor and a CMOS switching transistor. Each input shielding transistor has its gate terminal coupled to a shielding voltage set approximately midway between ground potential and the full-range VDD power supply voltage. The shielding transistor is coupled between the full-range input signal and the gate of the switching transistor. The drain of each switching transistor is, in turn, coupled by an output shielding transistor to a full-range output terminal for providing a full-range output signal. The gate terminals of each output shielding transistor are also coupled to the shielding voltage. The input shielding transistors and output shielding transistors prevent any gate oxide voltage or channel voltage from exceeding one-half of the voltage difference between ground potential and the positive power supply voltage VDD, while allowing the output signal to swing full range from ground potential to VDD.

One drawback of the circuitry described in the above-referenced '054 patent is the increase in the number of transistors required to implement typical logic functions. For example, a conventional low voltage CMOS inverter circuit usually requires only two CMOS transistors. When such an inverter is constructed using the technique described within the '054 patent, the number of transistors required increases from two to six. Even though the number of transistors is increased by a factor of three, the device geometries remain small, so that there is a net savings of chip real estate when compared with a two-transistor inverter using larger device geometries to tolerate higher voltages. However, if the number of transistors could be further reduced, the savings of chip area would be even greater.

In view of the foregoing, it is an object of the present invention to provide CMOS integrated circuit transistor configurations which can be operated over a power supply range significantly exceeding 5 volts in magnitude (i.e., a higher voltage range) while still using CMOS transistor geometries, and CMOS processing techniques, which are conventionally used for CMOS integrated circuits that operate over a standard 5 volt power supply range.

It is another object of the present invention to provide CMOS integrated logic circuits which permits the use of larger power supply voltages for generating output signals of greater voltage magnitude while retaining high density advantages of low-voltage CMOS processing.

It is still another object of the present invention to provide CMOS integrated circuit transistor configurations which use low-voltage type CMOS transistors in conjunction with higher-voltage power supply ranges while preventing channel breakdown, gate oxide breakdown, and junction breakdown failure modes.

A further object of the present invention is to provide such CMOS integrated circuit transistor configurations which use low-voltage type CMOS transistors in conjunction with higher-voltage power supply ranges without impairing the reliability of such integrated circuits.

A still further object of the present invention is to provide such CMOS integrated circuit transistor configurations which use low-voltage type CMOS transistors in conjunction with higher-voltage power supply ranges without significantly increasing the cost of manufacturing such integrated circuits.

A yet further object of the present invention is to provide such CMOS integrated circuit configurations which use fewer transistors, and hence, less chip area, than the equivalent logic structures disclosed within the above-mentioned '054 patent.

These and other objects of the present invention will become more apparent to those skilled in the art as the description of the present invention proceeds.

SUMMARY OF THE INVENTION

Briefly described, and in accordance with the preferred embodiments thereof, the present invention is a CMOS integrated circuit transistor configuration for allowing operation at relatively higher power supply voltages, while retaining the smaller device geometries of lower voltage CMOS processing, and including a first n-channel CMOS switching transistor, the source terminal of which is coupled to a first power supply conductor, e.g. ground potential. The gate terminal of the first n-channel CMOS transistor is coupled to a first input terminal for receiving a first input signal. The drain terminal of the first n-channel CMOS transistor is coupled to a first output terminal.

Likewise, the integrated circuit includes a first p-channel CMOS switching transistor, the source terminal of which is coupled to a second power supply conductor, e.g. positive voltage supply conductor VDD. The gate terminal of the first p-channel CMOS transistor is coupled to a second input terminal for receiving a second input signal. The drain terminal of the first p-channel CMOS transistor is coupled to a second output terminal.

The integrated circuit of the present invention further includes at least one shielding voltage conductor providing a shielding voltage that is approximately midway between the first and second power supply voltages. The first input signal received by the first input terminal has a voltage that switches within the range of voltages defined by the first power supply voltage and the shielding voltage; likewise, the second input signal received by the second input terminal has a voltage that switches within the range of voltages defined by the shielding voltage and the second power supply voltage. The first and second input signals track each other and have the same polarity as each other, although they switch within different voltage ranges.

The integrated circuit of the present invention also includes a second n-channel CMOS transistor, the source terminal of which is coupled to the first output terminal. The gate terminal of the second n-channel CMOS transistor is coupled to the shielding voltage conductor. Similarly, a second p-channel CMOS transistor has its source terminal coupled to the second output terminal. The gate terminal of the second p-channel CMOS transistor is coupled to the shielding voltage conductor, and the drain terminal of the second p-channel CMOS transistor is coupled to the drain terminal of the second n-channel CMOS transistor.

The magnitude of the difference between the first and second power supply voltages defines a predetermined full-range operating voltage. Each of the first and second n-channel CMOS transistors, and each of said first and second p-channel CMOS transistors, is preferably a low-voltage device that operates reliably only when the voltage difference between its gate terminal and its source and drain terminals, respectively, is less than the predetermined full-range operating voltage. The first output terminal provides a first output signal having a voltage that switches within the range of voltages defined by the first power supply voltage and the shielding voltage. Likewise, the second output terminal provides a second output signal having a voltage that switches within the range of voltages defined by the shielding voltage and the second power supply voltage. Thus, the first and second output signals may be used to drive the first and second input terminals of a like logic gate.

The integrated circuit described above can provide a basic logic inversion function. Other logic circuits, such as conventional NAND and logic NOR logic gates, can easily be formed by combining additional switching transistors either in series, or in parallel, with the switching transistors described above. For example, to form a two-input NAND logic gate, third and fourth input terminals are provided for receiving a third input signal having a voltage that switches between the first power supply voltage and the shielding voltage, and for receiving a fourth input signal having a voltage that switches between the shielding voltage and the second power supply voltage, respectively. The third and fourth input signals track each other and have the same polarity as each other, although they switch within different voltage ranges. A third n-channel CMOS transistor has its gate terminal coupled to the third input terminal and is coupled in series between the drain terminal of the first n-channel CMOS transistor and the first output terminal. In addition, a third p-channel CMOS transistor has its gate terminal coupled to the fourth input terminal and is coupled in parallel with the first p-channel CMOS transistor between the second power supply conductor and the second output terminal. A two-input nor gate can be formed in a similar manner merely by coupling the third n-channel CMOS transistor in parallel with the first n-channel CMOS transistor and by coupling the third p-channel CMOS transistor in series with the first p-channel CMOS transistor.

If desired, the shielding voltage conductor to which the gate of the second n-channel CMOS transistor is coupled could be different from the shielding voltage conductor to which the gate of the second p-channel CMOS transistor is coupled.

BRIEF DESCRIPTION OF THE DRAWINGS

FIG. 4 is a circuit schematic of a two-input NAND gate constructed in accordance with the teachings of the present invention.

FIG. 5 is a circuit schematic of a two-input NOR gate constructed in accordance with the teachings of the present invention.

DETAILED DESCRIPTION OF THE PREFERRED EMBODIMENTS

Figure 1:
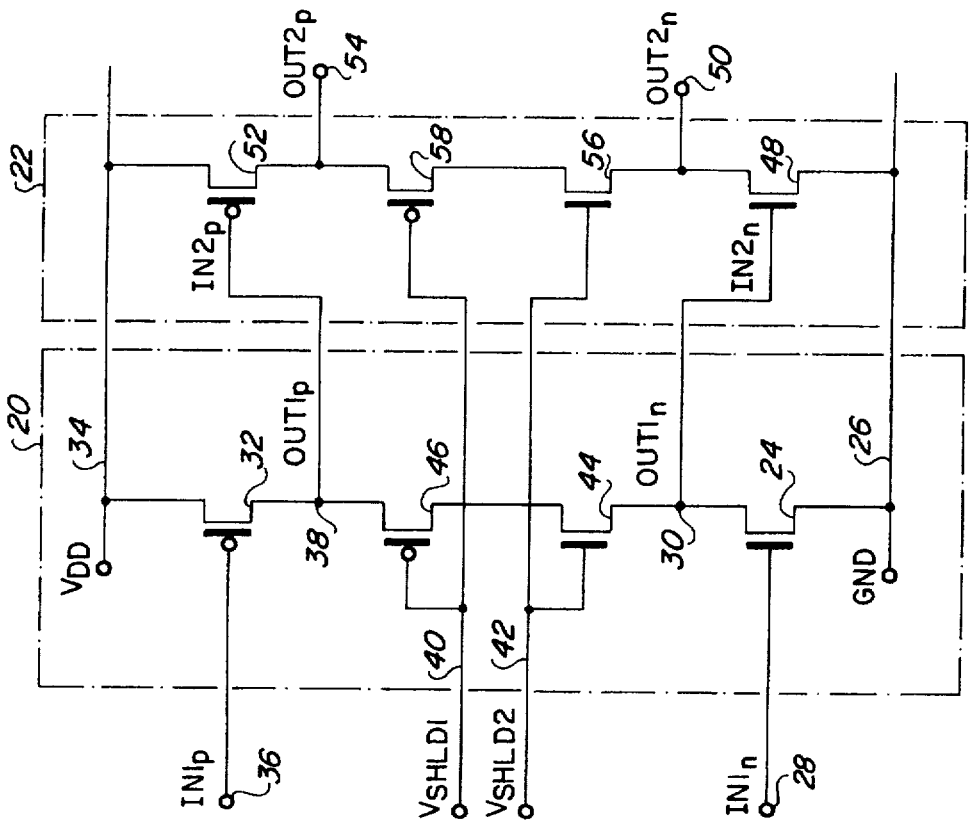
FIG. 1 is a circuit schematic of a first logic inversion gate of the type embodying the present invention driving a second logic inversion gate of the same type.

Within FIG. 1, two logic inversion gates are shown in accordance with the present invention. The first such logic inversion gate is shown within dashed block 20, and the second such logic inversion gate is shown within dashed block 22. First logic inversion gate 20 includes a first n-channel CMOS switching transistor 24, the source terminal of which is coupled to first power supply conductor 26 conducting a voltage equal to ground potential (GND). The gate terminal of switching transistor 24 is coupled to first input terminal 28 (IN1n) for receiving a first input signal. The drain terminal of switching transistor 24 is coupled to first output terminal 30 (OUT1n) for providing a first output signal.

Similarly, first inversion gate 20 also includes a first p-channel CMOS switching transistor 32, the source terminal of which is coupled to second power supply conductor 34 which conducting a positive supply voltage (VDD). The gate terminal of switching transistor 32 is coupled to second input terminal 36 (IN1p) for receiving a second input signal related to the first input signal. The drain terminal of switching transistor 32 is coupled to second output terminal 38 (OUT1p) for providing a second output signal related to the first output signal.

The magnitude of the difference between the first power supply voltage (GND) conducted by first power supply conductor 26 and the second power supply voltage (VDD) conducted by second power supply conductor 34 defines a predetermined operating voltage range for inversion gates 20 and 22. Inversion gate 20 is also provided with at least one shielding voltage conductor 40 (VSHLD1) adapted to receive a shielding voltage, the shielding voltage being approximately midway between the first and second power supply voltages. Thus, if the power supply conductors VDD and GND are at voltages of +10 volts and ground potential, respectively, for example, then it may be assumed for the present discussion that shielding voltage VSHLD1 is biased at approximately +5 volts. As shown in FIG. 1, a second shielding voltage conductor 42 (VSHLD2) may also be provided, if desired, independent from first shielding voltage conductor 40; in such case, the second shielding voltage VSHLD2 is also disposed approximately midway between the first and second power supply voltages, although VSHLD1 and VSHLD2 may be somewhat offset from each other, if desired.

Still referring to FIG. 1, inversion gate 20 also includes a second n-channel CMOS transistor 44 which functions as an output shielding transistor. Transistor 44 has its source terminal coupled to the first output terminal 30, and its gate terminal coupled to the shielding voltage conductor 42 (VSHLD2). Inversion gate 20 also includes a second p-channel CMOS transistor 46, which also functions as an output shielding transistor. Transistor 46 has its source terminal coupled to the second output terminal 38, and its gate terminal coupled to the shielding voltage conductor 40 (VSHLD1). As their names imply, output shielding transistors 44 and 46 shield the logic switching transistors to which they are connected from excessive voltages. The shield voltage VSHLD prevents the drain terminal 30 of n-channel switching transistor 24 from having a voltage higher than VSHLD−Vtn, or just less than +5 volts, even if the drain terminal of output shielding transistor 44 is at +10 volts. Likewise, the shield voltage VSHLD also prevents the drain terminal 38 of p-channel switching transistor 32 from having a voltage lower than VSHLD+Vtp, or just above +5 volts, even if the drain terminal of output shielding transistor 46 is at 0 volts. The values for Vtn and Vtp are assumed to be positive. Typical ranges for Vtn in a standard n-well CMOS process would range from 0.5 to 1.0 volts, and Vtp would range from 0.6 to 1.1 volts. These output shielding transistors 44 and 46 effectively protect the n and p channel logic sections from gate oxide and channel breakdown possibilities.

For purposes of explaining the present invention, it will be assumed that n-channel transistors 24 and 44, and p-channel transistors 32 and 46, are all conventional CMOS transistors produced using a typical low-voltage (e.g., 5 volt) CMOS process. It will also be assumed that VDD is at +10 volts, and that the shield voltages VSHLD1 AND VSHLD2 are at +5 volts. It is further assumed that the first input signal IN1n switches between GND and +5 volts, and that second input signal IN1p switches between +5 volts and +10 volts. In a first logic state, the first and second input signals IN1n and IN1p are "high", i.e., IN1n is +5 volts and IN1p is at +10 volts. In this case, the gate of transistor 24 is +5 volts, transistor 24 is conductive, and the first output terminal 30 (OUT1n) is "low" at zero volts. Thus, with respect to transistor 24, the gate-to-source and gate-to-drain voltages are no more than 5 volts in magnitude. The gate terminal of shield transistor 44 is at +5 volts, while the source terminal of shield transistor 44 is at zero volts; transistor 44 is therefore turned "on" and pulls its drain terminal toward 0 volts. Assuming that the shield voltage (VSHLD) is set at half of the power supply voltage of the circuit [(VDD–GND)/2 ], or +5 volts in the present example, then the gate oxide of output shielding transistors 44 and 46 will never see more than half the power supply voltage (i.e., no more than 5 volts), regardless of the voltages on output terminals 30 and 38.

Since IN1p is "high", the gate terminal of p-channel transistor 32 is at +10 volts, and transistor 32 is "off". The voltage at second output terminal 38 (OUT1p) begins to float downward, but remains at least one gate threshold voltage above the shielding voltage as transistor 46 would otherwise be rendered non-conductive. Accordingly, the gate-to-drain, gate-to-source, and drain-to-source voltages associated with transistor 32 are all of a magnitude less than 5 volts. Also note that the first output signal OUT1n and the second output signal OUT1p track together; first output signal OUT1n is low at zero volts, and OUT1p is low at approximately one gate threshold above the shielding voltage.

Now, in the opposite logic state, assume that the first and second input signals IN1n and IN1p are "low", i.e., IN1n is 0 volts and IN1p is at +5 volts. In this case, the gate of transistor 24 is 0 volts, transistor 24 is "off", and the first output terminal 30 (OUT1n) starts floating positive; however, output terminal 30 can rise no further than one threshold voltage below the shielding voltage, since shielding transistor 44 would otherwise be rendered non-conductive. Thus, with respect to transistor 24, the gate-to-source, gate-to-drain, and drain-to-source voltages are no more than 5 volts in magnitude. The gate terminal of shield transistor 44 is at +5 volts, while the source terminal of shield transistor 44 is at zero volts. Since IN1p is "low" at +5 volts, p-channel transistor 32 is "on", and the second output terminal 38 (OUT1p) is pulled up to +10 volts. Since the source terminal of shield transistor 46 is at +10 volts and its gate terminal is at +5 volts, shield transistor 46 is also turned "on", and the drain terminal of transistor 46 rises toward +10 volts. Once again, for each transistor, the gate-to-source, gate-to-drain, and drain to source voltages are at most 5 volts in magnitude. Once again, the first output signal OUT1n and second output signal OUT1p track together; first output signal OUT1n is high at a gate threshold below the shielding voltage, and OUT1p is high at +10 volts.

As shown in FIG. 1, the first and second output terminals 30 and 38 of the first inversion gate can provide the first and second input signals IN2n and IN2p, respectively, to the second inversion gate 22. Within second inversion gate 22, a third n-channel CMOS transistor 48 has its gate terminal coupled to first output terminal 30 for receiving the first output signal therefrom. The drain terminal of the third n-channel CMOS transistor 48 is coupled to a third output terminal 50 (OUT2n) for providing a third output signal having a voltage that switches within the range of voltages defined by the first power supply voltage and the shielding voltage. Similarly, second inversion gate 22 includes a third p-channel CMOS transistor 52, the gate terminal of which is coupled to the second output terminal 38 for receiving the second output signal therefrom. The drain terminal of third p-channel CMOS transistor 52 is coupled to a fourth output terminal 54 for providing a fourth output signal having a voltage that switches within the range of voltages defined by the shielding voltage and the second power supply voltage.

As was true for inversion gate 20, second inversion gate 22 includes a pair of output shielding transistors 56 and 58. Fourth n-channel CMOS transistor 56 has its source terminal coupled to third output terminal 50, and its gate terminal coupled to the shielding voltage conductor 42. Fourth p-channel CMOS transistor 58 has its source terminal coupled to fourth output terminal 54, and its gate terminal coupled to the shielding voltage conductor 40. The drain terminal of fourth p-channel CMOS transistor 58 is coupled to the drain terminal of fourth n-channel CMOS transistor 56. Once more, paired output signals OUT2n and OUT2p track together and simultaneously switch "high" and "low".

Comparing the inversion circuits shown in FIG. 1 to the inversion circuit shown in U.S. Pat. No. 5,465,054, it will be noted that the transistor count per inversion gate has dropped from six transistors to four transistors by eliminating input shielding transistors. The only price paid for reducing the transistor count is the need to route dual input signals from each gate, and the need to route dual output signals from each gate. However, many integrated circuits have a sufficient number of metallization layers to allow for such extra metallization runs without increasing the size of the integrated circuit already dictated by the device geometries themselves. In this event, the savings of at least two transistors per gate is significant. Because the area of a CMOS circuit is proportional to the square of the basic device dimensions, if the geometry can be halved, then the resulting area is one fourth of the original. CMOS geometries are typically expressed as the minimum length of the transistor gate which can be fabricated. All other critical dimensions are proportional to the length of the gate in some fashion. Thus, doubling the length of CMOS transistor geometries to account for higher voltages can quadruple the chip area required to implement a circuit. Building an inversion gate capable of operating from a 10 volt power supply range using only four conventional (i.e., 5 volt process) CMOS transistors requires only 2 times as much area as a conventional, low-voltage two transistor inversion gate. By comparison, building an inversion gate using only two larger (i.e., 10 volt process) transistors can take 4 times the area as a conventional two transistor inversion gate.

Figure 2:
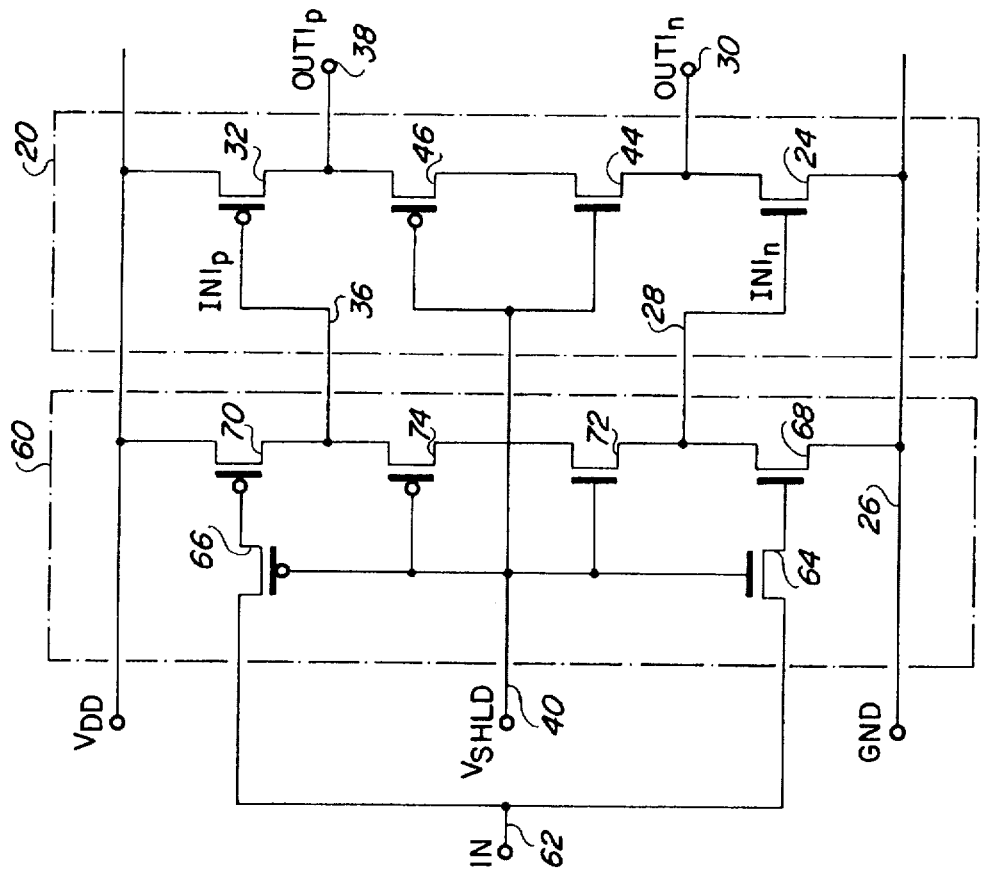
FIG. 2 is a circuit schematic of a full-range input buffer circuit constructed in accordance with prior U.S. Pat. No. 5,465,054, driving a logic inversion gate of the type embodying the present invention.

In the explanation of FIG. 1 above, input signals IN1n and IN1p may be supplied by a previous logic gate of the same type. However, if such input signals are provided externally, as by an input signal that switches full-range between ground and +10 volts, then an input buffer circuit is needed to generate IN1n and IN1p within the proper voltage ranges of 0 to +5 volts, and +5 volts to +10 volts, respectively. In FIG. 2, an input buffer circuit is shown which is capable of providing such function. The input buffer circuit is shown within dashed block 60, and operates in a manner somewhat similar to that described in U.S. Pat. No. 5,465,054. Briefly, input signal IN is a full-range input signal that switches between GND and VDD. Input signal IN is received on conductor 62 and is coupled to the drain terminal of low-voltage, n-channel input shielding transistor 64 and to the drain terminal of low-voltage, p-channel input shielding transistor 66. The source terminal of input shielding transistor 64 is coupled to the gate terminal of n-channel switching transistor; likewise, the source terminal of input shielding transistor 66 is coupled to the gate terminal of p-channel switching transistor 70. The gate terminals of input shielding transistors 64 and 66 are both connected to the shielding voltage conductor 40. Input shielding transistor 64 prevents the gate terminal of transistor 68 from rising above VSHLD when input voltage IN rises high toward +10 volts. Likewise, input shielding transistor 66 prevents the gate terminal of transistor 70 from falling below VSHLD when input voltage IN falls to zero volts.

Within FIG. 2, the drain terminal of switching transistor 68 is coupled to the source terminal of output shielding transistor 72, the gate terminal of which is also coupled to VSHLD conductor 40. Similarly, the drain terminal of switching transistor 70 is coupled to the source terminal of output shielding transistor 74, the gate terminal of which is also coupled to VSHLD conductor 40. The drain terminals of output shielding transistors 72 and 74 are coupled in common. However, instead of taking a single full-range output from input buffer circuit 60 at the common drain terminals of output shielding transistors 72 and 74, as taught in U.S. Pat. No. 5,465,054, dual limited range output signals are taken from the drain terminals of switching transistors 68 and 70 and are used to supply input signals IN1n and IN1p on input terminals 28 and 36, respectively.

Figure 3:
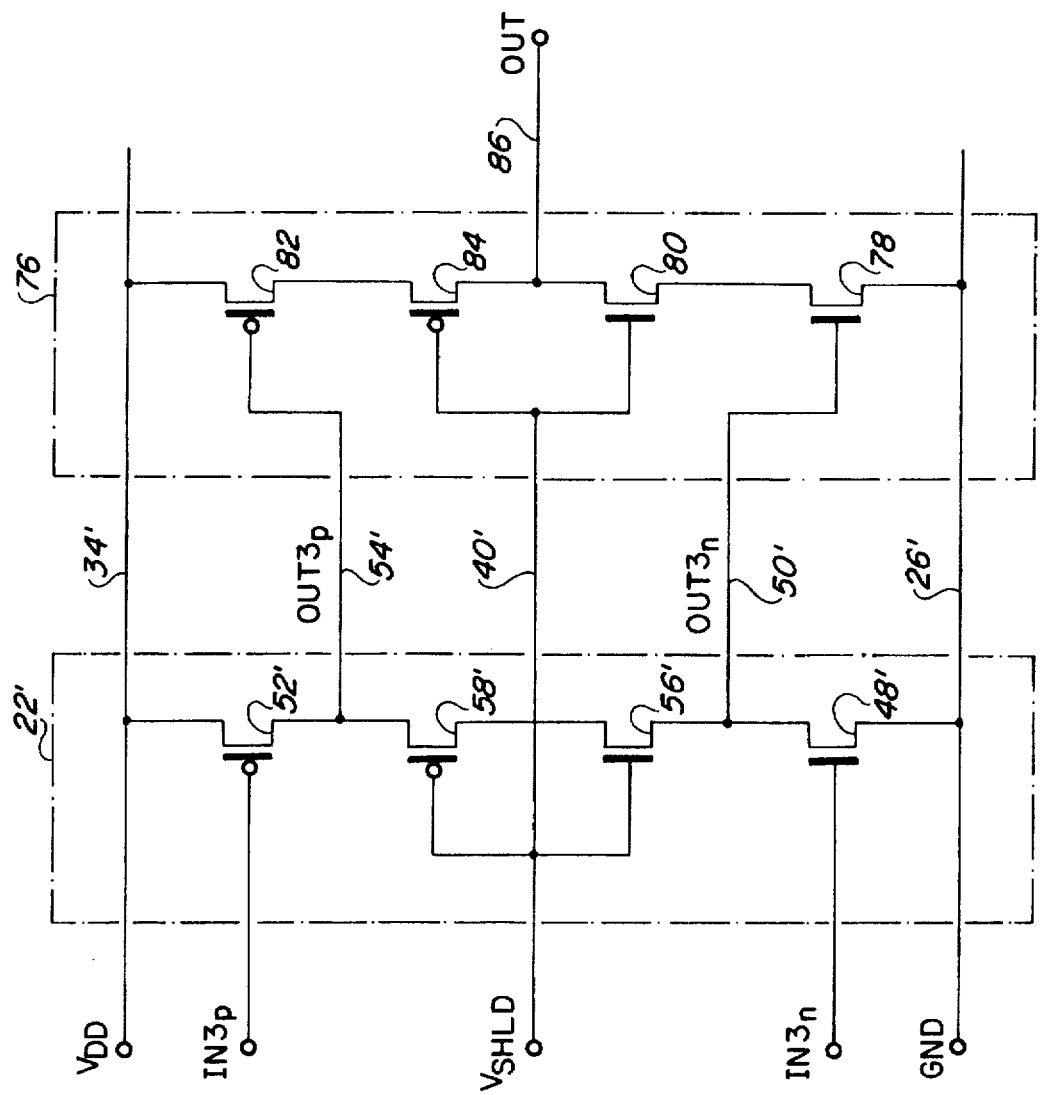
FIG. 3 is a circuit schematic of a logic inversion gate of the type embodying the present invention driving an output buffer circuit constructed in accordance with prior U.S. Pat. No. 5,465,054 to provide a full-range output signal.

While the logic gates shown in FIG. 1 can be used to construct internal logic circuitry, it will ultimately become necessary to drive an output pin of an integrated circuit with a full-range output signal that switches between GND (zero volts) and VDD (+10 volts, for example). It is relatively easy to generate a full-range output signal, as demonstrated in FIG. 3. Within FIG. 3, the inversion gate shown in dashed block 22' is similar to inversion gate 22 in FIG. 1, and like components have been designated with identical primed reference numerals. Output buffer gate 76 includes an n-channel switching transistor 78, the gate terminal of which directly receives output signal 50' from inversion gate 22'. The drain terminal of switching transistor 78 does not provide an output signal; however, the drain terminal of transistor 78 is coupled to the source of an output shielding transistor 80, the drain terminal of which is coupled to full-range output terminal 86. The gate terminal of output shielding transistor 80 is coupled to VSHLD, and for the reasons explained above, the source terminal of transistor 80 is not permitted to rise above +5 volts. Similarly, output buffer gate 76 includes a p-channel switching transistor 82, the gate terminal of which directly receives output signal 54' from inversion gate 22'. The drain terminal of switching transistor 82 does not provide an output signal; however, the drain terminal of transistor 82 is coupled to the source of an output shielding transistor 84, the drain terminal of which is coupled to full-range output terminal 86. The gate terminal of output shielding transistor 80 is coupled to VSHLD, and for the reasons explained above, the source terminal of transistor 84 is not permitted to fall below +5 volts. The full-range output signal (OUT) generated at output terminal 86 switches between GND (zero volts) and VDD (+10 volts, for example).

FIG. 4 illustrates the modification of an inversion gate of the type shown in FIG. 1 in order to provide a two-input NAND gate using conventional low-voltage CMOS transistors over a high voltage operating range. The NAND gate includes two n-channel switching transistors 88 and 90, two p-channel switching transistors 92 and 94, and two output shielding transistors 96 and 98. One of the inputs to the NAND gate is the input signal represented by dual inputs IN4n and IN4p. The other input to the NAND gate is the input signal represented by dual inputs IN5n and IN5p.

Signal IN4n drives the gate terminal of n-channel switching transistor 90, while signal IN5n drives the gate terminal of n-channel switching transistor 88. The source and drain terminals of switching transistors 88 and 90 are connected in series between the GND supply conductor 26 and the first output terminal 100. Input signal IN4p drives the gate terminal of p-channel switching transistor 92, while signal IN5p drives the gate terminal of p-channel switching transistor 94. The source and drain terminals of p-channel switching transistors 92 and 94 are coupled in parallel between the positive voltage supply conductor 34 (VDD) and the second output terminal 102. Output shielding transistors 96 and 98 are coupled in series between the first and second output terminals 100 and 102; each of the gate terminals of output shielding transistors 96 and 98 is coupled to the shielding voltage VSHLD. This circuit provides a basic NAND logic function. In other words, if IN4n/IN4p and IN5n/IN5p are both "high", then OUT6n/OUT6p are "low"; otherwise, OUT6n/OUT6p are "high".

FIG. 5 shows the modification of an inversion gate of the type shown in FIG. 1 in order to provide a two-input NOR gate using conventional low-voltage CMOS transistors over a high voltage operating range. The components shown in FIG. 5 generally correspond with those described above in regard to FIG. 4, and like components are designated by like primed reference numerals. The key distinction between the NOR gate of FIG. 5 and the NAND gate of FIG. 4 is that n-channel switching transistors 88' and 90' are connected in parallel rather than in series, and p-channel switching transistors 92' and 94' are connected in series rather than in parallel. This circuit provides a basic NOR logic function. In other words, if IN4n/IN4p and IN5n/IN5p are both "low", then OUT6n/OUT6p are "high"; otherwise, OUT6n/OUT6p are "low".

While only a small number of high voltage logic gates have been described herein in accordance with the teachings of the present invention, those skilled in the art will appreciate that a wide variety of logic building blocks, such as gates, flip-flops, registers, shift registers, adders, and other logic elements currently made from CMOS logic gates may also be made from the high voltage logic gate transistor configurations described herein. It will be appreciated that the present invention extends to all standard CMOS logic configurations.

While the present invention has been described with respect to several preferred embodiments thereof, such description is for illustrative purposes only, and is not to be construed as limiting the scope of the invention. Various modifications and changes may be made to the described embodiments by those skilled in the art without departing from the true spirit and scope of the invention as defined by the appended claims.

We claim:

1. A CMOS integrated circuit transistor configuration for allowing operation at relatively higher power supply voltages, comprising in combination:

a. first and second power supply conductors adapted to receive first and second power supply voltages, the magnitude of the difference between the first and second power supply voltages corresponding to a predetermined operating voltage;

b. a shielding voltage conductor adapted to receive a shielding voltage, the shielding voltage being approximately midway between the first and second power supply voltages;

c. a first input terminal for receiving a first input signal having a voltage that switches within the range of voltages defined by the first power supply voltage and the shielding voltage;

d. a second input terminal for receiving a second input signal having a voltage that switches within the range of voltages defined by the shielding voltage and the second power supply voltage, the second input signal having the same polarity as the first input signal;

e. a first output terminal for providing a first output signal having a voltage that switches within the range of voltages defined by the first power supply voltage and the shielding voltage;

f. a second output terminal for providing a second output signal having a voltage that switches within the range of voltages defined by the shielding voltage and the second power supply voltage;

g. a first n-channel CMOS transistor having source, drain and gate terminals, the source terminal of said first n-channel CMOS transistor being coupled to the first power supply conductor, the gate terminal of said first n-channel CMOS transistor being coupled to said first input terminal for receiving the first input signal, and the drain terminal of said first n-channel CMOS transistor being coupled to the first output terminal;

h. a second n-channel CMOS transistor having source, drain and gate terminals, the source terminal of said second n-channel CMOS transistor being coupled to the first output terminal, the gate terminal of said second n-channel CMOS transistor being coupled to the shielding voltage conductor;

i. a first p-channel CMOS transistor having source, drain and gate terminals, the source terminal of said first p-channel CMOS transistor being coupled to the second power supply conductor, the gate terminal of said first p-channel CMOS transistor being coupled to said second input terminal for receiving the second input signal, and the drain terminal of said first p-channel CMOS transistor being coupled to the second output terminal;

j. a second p-channel CMOS transistor having source, drain and gate terminals, the source terminal of said second p-channel CMOS transistor being coupled to the second output terminal, the gate terminal of said second p-channel CMOS transistor being coupled to the shielding voltage conductor, and the drain terminal of said second p-channel CMOS transistor being coupled to the drain terminal of said second n-channel CMOS transistor; and k. each of said first and second n-channel CMOS transistors, and each of said first and second p-channel CMOS transistors, operating reliably only when the voltage difference between its gate terminal and its source and drain terminals, respectively, is less than said predetermined operating voltage.

2. The CMOS integrated circuit transistor configuration as recited by claim 1 wherein one of the first and second power supply voltages is ground potential, and wherein the source terminal of said first n-channel transistor is coupled to ground potential.

3. The CMOS integrated circuit transistor configuration as recited by claim 1 wherein one of the first and second power supply voltages is a positive supply voltage above ground potential, and wherein the source terminal of said first p-channel CMOS transistor is coupled to the positive supply voltage.

4. The CMOS integrated circuit transistor configuration as recited by claim 1 and further including:

a. a third input terminal for receiving a third input signal having a voltage that switches within the range of voltages defined by the first power supply voltage and the shielding voltage;

b. a third n-channel CMOS transistor for coupling the drain terminal of said n-channel CMOS transistor to the first output terminal, said third n-channel CMOS transistor having source, drain and gate terminals, the source terminal of said third n-channel CMOS transistor being coupled to the drain terminal of said first n-channel CMOS transistor, the gate terminal of said third n-channel CMOS transistor being coupled to said third input terminal for receiving the third input signal, and the drain terminal of said third n-channel CMOS transistor being coupled to the first output terminal;

c. a fourth input terminal for receiving a fourth input signal having a voltage that switches within the range of voltages defined by the shielding voltage and the second power supply voltage the fourth input signal having the same polarity as the third input signal;

d. a third p-channel CMOS transistor having source, drain and gate terminals, the source terminal of said third p-channel CMOS transistor being coupled to the second power supply conductor, the gate terminal of said third p-channel CMOS transistor being coupled to said fourth input terminal for receiving the fourth input signal, and the drain terminal of said third p-channel CMOS transistor being coupled to the second output terminal.

5. The CMOS integrated circuit transistor configuration as recited by claim 1 and further including:

a. a third input terminal for receiving a third input signal having a voltage that switches within the range of voltages defined by the first power supply voltage and the shielding voltage;

b. a third n-channel CMOS transistor said third n-channel CMOS transistor having source, drain and gate terminals, the source terminal of said third n-channel CMOS transistor being coupled to the first power supply conductor, the gate terminal of said third n-channel CMOS transistor being coupled to said third input terminal for receiving the third input signal, and the drain terminal of said third n-channel CMOS transistor being coupled to the first output terminal;

c. a fourth input terminal for receiving a fourth input signal having a voltage that switches within the range of voltages defined by the shielding voltage and the second power supply voltage, the fourth input signal having the same polarity as the third input signal;

d. a third p-channel CMOS transistor having source, drain and gate terminals for coupling the drain terminal of said first p-channel CMOS transistor to the second output terminal, the source terminal of said third p-channel CMOS transistor being coupled to the drain terminal of said first p-channel CMOS transistor, the gate terminal of said third p-channel CMOS transistor being coupled to said fourth input terminal for receiving the fourth input signal, and the drain terminal of said third p-channel CMOS transistor being coupled to the second output terminal.

6. The CMOS integrated circuit transistor configuration as recited by claim 1 and further including:

a. a third output terminal for providing a third output signal having a voltage that switches within the range of voltages defined by the first power supply voltage and the shielding voltage;

b. a fourth output terminal for providing a fourth output signal having a voltage that switches within the range of voltages defined by the shielding voltage and the second power supply voltage;

c. a third n-channel CMOS transistor having source, drain and gate terminals, the source terminal of said third n-channel CMOS transistor being coupled to the first power supply conductor, the gate terminal of said third n-channel CMOS transistor being coupled to said first output terminal for receiving the first output signal therefrom, and the drain terminal of said third n-channel CMOS transistor being coupled to the third output terminal;

d. a fourth n-channel CMOS transistor having source, drain and gate terminals, the source terminal of said fourth n-channel CMOS transistor being coupled to the third output terminal, the gate terminal of said fourth n-channel CMOS transistor being coupled to the shielding voltage conductor;

e. a third p-channel CMOS transistor having source, drain and gate terminals, the source terminal of said third p-channel CMOS transistor being coupled to the second power supply conductor, the gate terminal of said third p-channel CMOS transistor being coupled to said second output terminal for receiving the second output signal therefrom, and the drain terminal of said third p-channel CMOS transistor being coupled to the fourth output terminal; and f. a fourth p-channel CMOS transistor having source, drain and gate terminals, the source terminal of said fourth p-channel CMOS transistor being coupled to the fourth output terminal, the gate terminal of said fourth p-channel CMOS transistor being coupled to the shielding voltage conductor, and the drain terminal of said fourth p-channel CMOS transistor being coupled to the drain terminal of said fourth n-channel CMOS transistor.

7. A CMOS integrated circuit transistor configuration for allowing operation at relatively higher power supply voltages, comprising in combination:

a. first and second power supply conductors adapted to receive first and second power supply voltages, the magnitude of the difference between the first and second power supply voltages corresponding to a predetermined operating voltage;

b. a first shielding voltage conductor adapted to receive a first shielding voltage, the first shielding voltage being approximately midway between the first and second power supply voltages;

c. a second shielding voltage conductor adapted to receive a second shielding voltage, the second shielding voltage being approximately midway between the first and second power supply voltages;

d. a first input terminal for receiving a first input signal having a voltage that switches within the range of voltages defined by the first power supply voltage and the first shielding voltage;

e. a second input terminal for receiving a second input signal having a voltage that switches within the range of voltages defined by the second shielding voltage and the second power supply voltage, the second input signal having the same polarity as the first input signal;

f. a first output terminal for providing a first output signal having a voltage that switches within the range of voltages defined by the first power supply voltage and the first shielding voltage;

g. a second output terminal for providing a second output signal having a voltage that switches within the range of voltages defined by the second shielding voltage and the second power supply voltage;

h. a first n-channel CMOS transistor having source, drain and gate terminals, the source terminal of said first n-channel CMOS transistor being coupled to the first power supply conductor, the gate terminal of said first n-channel CMOS transistor being coupled to said first input terminal for receiving the first input signal, and the drain terminal of said first n-channel CMOS transistor being coupled to the first output terminal;

i. a second n-channel CMOS transistor having source, drain and gate terminals, the source terminal of said second n-channel CMOS transistor being coupled to the first output terminal, the gate terminal of said second n-channel CMOS transistor being coupled to the first shielding voltage conductor;

j. a first p-channel CMOS transistor having source, drain and gate terminals, the source terminal of said first p-channel CMOS transistor being coupled to the second power supply conductor, the gate terminal of said first p-channel CMOS transistor being coupled to said second input terminal for receiving the second input signal, and the drain terminal of said first p-channel CMOS transistor being coupled to the second output terminal;

k. a second p-channel CMOS transistor having source, drain and gate terminals, the source terminal of said second p-channel CMOS transistor being coupled to the second output terminal, the gate terminal of said second p-channel CMOS transistor being coupled to the second shielding voltage conductor, and the drain terminal of said second p-channel CMOS transistor being coupled to the drain terminal of said second n-channel CMOS transistor; and l. each of said first and second n-channel CMOS transistors, and each of said first and second p-channel CMOS transistors, operating reliably only when the voltage difference between its gate terminal and its source and drain terminals, respectively, is less than said predetermined operating voltage.

* * * * *